(12) United States Patent
Yuan et al.

(10) Patent No.: US 11,985,872 B2
(45) Date of Patent: May 14, 2024

(54) DISPLAY PANEL AND ELECTRONIC DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Can Yuan, Beijing (CN); Yongqian Li, Beijing (CN); Zhidong Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 456 days.

(21) Appl. No.: 17/309,882

(22) PCT Filed: Dec. 29, 2020

(86) PCT No.: PCT/CN2020/140744
§ 371 (c)(1),
(2) Date: Jun. 25, 2021

(87) PCT Pub. No.: WO2021/169571
PCT Pub. Date: Sep. 2, 2021

(65) Prior Publication Data
US 2022/0344435 A1 Oct. 27, 2022

(30) Foreign Application Priority Data
Feb. 27, 2020 (CN) .......................... 202010126491.X

(51) Int. Cl.
*H10K 59/131* (2023.01)
*G09G 3/3233* (2016.01)
*H10K 59/121* (2023.01)

(52) U.S. Cl.
CPC ......... *H10K 59/131* (2023.02); *G09G 3/3233* (2013.01); *G09G 2300/0408* (2013.01);
(Continued)

(58) Field of Classification Search
CPC .............. H10K 59/123; H10K 59/131; H10K 59/1216; H10K 59/1213; H10K 59/1315;
(Continued)

(56) References Cited

U.S. PATENT DOCUMENTS 6,380,672 B1  4/2002 Yudasaka
10,461,141 B2  10/2019 Choi
(Continued)

FOREIGN PATENT DOCUMENTS

CN  108022946 A  5/2018
CN  109728033 A  5/2019
(Continued)

OTHER PUBLICATIONS

First Chinese Office Action dated Mar. 28, 2023, for corresponding Chinese Application No. 202010126491.X.

*Primary Examiner* — Mouloucoulaye Inoussa
(74) *Attorney, Agent, or Firm* — Kinney & Lange, P.A.

(57) ABSTRACT

A display panel and an electronic device are provided. The display panel includes: a base substrate; a plurality of gate lines and a plurality of data lines located on the base substrate. A plurality of sub-pixel units are located on the base substrate, and at least one of the plurality of sub-pixel units includes a light-emitting element, a switching transistor, an induction transistor, a driving transistor and a storage transistor. In this sub-pixel unit, an orthographic projection of the switching transistor on the base substrate and an orthographic projection of the induction transistor on the base substrate are located on a first side of an orthographic projection of the storage capacitor on the base substrate. An
(Continued)

orthographic projection of the driving transistor on the base substrate is located on a second side of the orthographic projection of the storage capacitor on the base substrate.

12 Claims, 7 Drawing Sheets

(52) U.S. Cl.
CPC ............... *G09G 2300/0426* (2013.01); *G09G 2300/0842* (2013.01); *G09G 2320/0233* (2013.01); *H10K 59/1216* (2023.02)

(58) Field of Classification Search
CPC .. H10K 59/121; H10K 59/353; H10K 59/122; H10K 59/124; H10K 59/126; H10K 59/1201; H10K 50/813; G09G 3/3233; G09G 3/3275; G09G 3/3688; G09G 3/3677; G09G 3/3266; G09G 3/3225; G09G 2300/0426; G09G 2300/0842; G09G 2300/0408; G09G 2320/0233; G09G 2310/0262; G09G 2300/0819; G09G 2310/08; G09G 2310/0216; G09G 210/0286; G09G 2310/06; G09G 2300/0852; G09G 2300/0814; G09G 2310/0251; G02F 1/136209; G02F 1/13439; G02F 1/136295; G02F 1/1368; G02F 1/136231; H01L 27/1222; H01L 29/78696; H01L 29/78633; H01L 27/1225; H01L 27/124; H01L 27/1255; H01L 29/66969; H01L 29/7869; H01L 27/127
USPC ................ 345/206, 82, 215, 80; 257/40, 43; 438/34
See application file for complete search history.

(56) References Cited

U.S. PATENT DOCUMENTS

| | | |
|---|---|---|
| 10,468,477 B2 | 11/2019 | Jung et al. |
| 2015/0255518 A1 | 9/2015 | Watanabe et al. |
| 2017/0317155 A1 | 11/2017 | Oh et al. |
| 2018/0122888 A1 | 5/2018 | Jung et al. |
| 2018/0190205 A1* | 7/2018 | Choi .................... G09G 3/3225 |
| 2019/0131369 A1* | 5/2019 | Choi .................... H10K 59/131 |
| 2019/0355802 A1* | 11/2019 | Shim .................... H10K 59/131 |

FOREIGN PATENT DOCUMENTS

| | | |
|---|---|---|
| CN | 111326558 A | 6/2020 |
| JP | 2006343504 A | 12/2006 |

* cited by examiner

DISPLAY PANEL AND ELECTRONIC DEVICE

CROSS REFERENCE TO RELATED APPLICATION(S)

The present disclosure is a Section 371 National Stage Application of International Application No. PCT/CN2020/140744, filed on Dec. 29, 2020, entitled "DISPLAY PANEL AND ELECTRONIC DEVICE", and the PCT Application claims priority to the Chinese Patent Application No. 202010126491.X filed on Feb. 27, 2020, which are incorporated herein by reference in their entirety.

TECHNICAL FIELD

The present disclosure relates to a field of display technology, and in particular to a display panel and an electronic device.

BACKGROUND

OLED (Organic Light-Emitting Diode) devices are widely used in display panel technologies. At present, high-resolution and high-quality OLED display technologies are developing rapidly. A process of forming a light-emitting material layer generally includes an evaporation process and an inkjet printing process. When the inkjet printing process is used to form the light-emitting material layer, a thickness uniformity of a printed light-emitting material film layer has a great influence on display performance of the resulting display panel. Poor thickness uniformity in the printed light-emitting material film layer can lead to uneven display brightness and chromaticity of the panel, which may result in mura effects and other display defects.

SUMMARY

Embodiments of the present disclosure provide a display panel, including: a base substrate; a plurality of gate lines and a plurality of data lines located on the base substrate, wherein an orthographic projection of the plurality of gate lines on the base substrate overlaps an orthographic projection of the plurality of data lines on the base substrate; and a plurality of sub-pixel units located on the base substrate, wherein at least one of the plurality of sub-pixel units includes a light-emitting element, a switching transistor, an induction transistor, a driving transistor and a storage transistor, wherein in a same sub-pixel unit, an orthographic projection of the switching transistor on the base substrate and an orthographic projection of the induction transistor on the base substrate are located on a first side of an orthographic projection of the storage capacitor on the base substrate, and an orthographic projection of the driving transistor on the base substrate is located on a second side of the orthographic projection of the storage capacitor on the base substrate, and the first side and the second side are opposite to each other in a direction extending along the plurality of data lines.

In some embodiments, the switching transistor includes a first gate electrode, a first active region, a first source electrode and a first drain electrode; the induction transistor includes a second gate electrode, a second active region, a second source electrode and a second drain electrode; the driving transistor includes a third gate electrode, a third active region, a third source electrode and a third drain electrode; the storage capacitor includes a first storage electrode portion and a second storage electrode portion located on a side of the first storage electrode portion facing the base substrate, a first insulating layer is provided between the first storage electrode portion and the second storage electrode portion in a direction perpendicular to the base substrate, an orthographic projection of the first storage electrode portion on the base substrate at least partially overlaps an orthographic projection of the second storage electrode portion on the base substrate; the light-emitting element includes a cathode layer, an anode layer, and a light-emitting material layer located between the cathode layer and the anode layer in the direction perpendicular to the base substrate; in a same sub-pixel unit, one of the first source electrode and the first drain electrode of the switching transistor is electrically connected to the data line, and another of the first source electrode and the first drain electrode of the switching transistor is electrically connected to the second storage electrode portion; the third gate electrode of the driving transistor is electrically connected to the second storage electrode portion, the third source electrode of the driving transistor is electrically connected to the first storage electrode portion, the third drain electrode of the driving transistor is electrically connected to a high voltage level signal; one of the second source electrode and the second drain electrode of the induction transistor is electrically connected to the first storage electrode portion, and another of the second source electrode and the second drain electrode of the induction transistor is electrically connected to an induction line on the base substrate; the first storage electrode portion is electrically connected to the anode layer of the light-emitting element.

In some embodiments, the display panel further includes a pixel defining layer located on a side of the plurality of gate lines and plurality of the data lines away from the base substrate, the pixel defining layer includes a plurality of hollow portions, and the light-emitting material layer is arranged in the plurality of hollow portions of the pixel defining layer; the orthographic projection of the plurality of gate lines on the base substrate does not overlap an orthographic projection of the light-emitting material layer on the base substrate.

In some embodiments, the display panel further includes: a first metal layer located on the base substrate, wherein the plurality of gate lines are arranged in the first metal layer; and a second metal layer located on a side of the first metal layer away from the base substrate, wherein the plurality of data lines are arranged in the second metal layer, wherein the first insulating layer is located between the first metal layer and the second metal layer in the direction perpendicular to the base substrate, and a pad portion is further provided in the second metal layer, an orthographic projection of the pad portion on the base substrate at least partially overlaps the orthographic projection of the light-emitting material layer on the base substrate.

In some embodiments, the plurality of hollow portions in the pixel defining layer include a first hollow portion and a second hollow portion adjacent to each other, the plurality of gate lines include a first gate line and a second gate line adjacent to each other, an orthographic projection of the first gate line on the base substrate and an orthographic projection of the second gate line on the base substrate are located between an orthographic projection of the first hollow portion on the base substrate and an orthographic projection of the second hollow portion on the base substrate.

In some embodiments, the first gate electrode of the switching transistor is electrically connected to the first gate line, and the second gate electrode of the induction transistor is electrically connected to the second gate line.

In some embodiments, the first gate electrode, the second gate electrode and the third gate electrode are arranged in the first metal layer; the first source electrode, the first drain electrode, the second source electrode, the second drain electrode, the third source electrode, the third drain electrode, the first storage electrode portion and the induction line are arranged in the second metal layer; the display panel further includes an active layer located on a side of the first metal layer facing the base substrate, and the first active region, the second active region, the third active region and the second storage electrode portion are arranged in the active layer.

In some embodiments, the display panel further includes a planarization layer and a first via structure, the planarization layer is located on a side of the second metal layer away from the base substrate and on a side of the pixel defining layer facing the base substrate, the anode layer is located on a side of the planarization layer away from the base substrate and on the side of the pixel defining layer facing the base substrate, a first via structure that passes through the planarization layer, so that the anode layer is electrically connected to the first storage electrode portion through the first via structure.

In some embodiments, an orthographic projection of the first via structure on the base substrate does not overlap an orthographic projection of the plurality of hollow portions of the pixel defining layer on the base substrate.

In some embodiments, the orthographic projection of the first via structure on the base substrate is located between the orthographic projection of the first gate line on the base substrate and the orthographic projection of the second gate line on the base substrate.

In some embodiments, the display panel further includes: a second insulating layer located on a side of the active layer away from the base substrate and on a side of the first metal layer facing the base substrate; and a second via structure that passes through the first insulating layer and the second insulating layer, so that the first active region of the switching transistor is electrically connected to the first source electrode or the first drain electrode of the switching transistor through the second via structure.

In some embodiments, an orthographic projection of the second via structure on the base substrate does not overlap the orthographic projection of the plurality of hollow portions of the pixel defining layer on the base substrate.

In some embodiments, the orthographic projection of the second via structure on the base substrate is located between the orthographic projection of the first gate line on the base substrate and the orthographic projection of the second gate line on the base substrate.

In some embodiments, the storage capacitor further includes a third storage electrode portion arranged in a third metal layer located on a side of the active region facing the base substrate, wherein the orthographic projection of the first storage electrode portion on the base substrate at least partially overlaps the orthographic projection of the second storage electrode portion on the base substrate, and an orthographic projection of the third storage electrode portion on the base substrate at least partially overlaps the orthographic projection of the second storage electrode portion on the base substrate; the third insulating layer is located on a side of the third metal layer away from the base substrate and on the side of the active layer facing the base substrate; the storage capacitor further includes a third via structure that passes through the first insulating layer, the second insulating layer and the third insulating layer, so that the first storage electrode portion is electrically connected to the third storage electrode portion through the third via structure.

In some embodiments, each of the orthographic projection of the first storage electrode portion of the storage capacitor on the base substrate, the orthographic projection of the second storage electrode portion of the storage capacitor on the base substrate and the orthographic projection of the third storage electrode portion of the storage capacitor on the base substrate at least partially overlaps the orthographic projection of the plurality of hollow portions of the pixel defining layer on the base substrate.

In some embodiments, at least 70% of an area of each of the orthographic projection of the first storage electrode portion of the storage capacitor on the base substrate, the orthographic projection of the second storage electrode portion of the storage capacitor on the base substrate and the orthographic projection of the third storage electrode portion of the storage capacitor on the base substrate falls within the orthographic projection of the plurality of hollow portions of the pixel defining layer on the base substrate.

The embodiments of the present disclosure further provide an electronic device, including the display panel according to any one of the embodiments described above.

BRIEF DESCRIPTION OF THE DRAWINGS

In order to more clearly illustrate the technical solutions in the embodiments of the present disclosure or the related art, the drawings required in the description of the embodiments are briefly introduced below. The drawings in the following description illustrate only some embodiments of the present disclosure. For those of ordinary skilled in the art, further embodiments within the scope of the present application may be obtained from these drawings and the accompanying description without carrying out any inventive effort.

DETAILED DESCRIPTION OF EMBODIMENTS

In order to make objectives, technical solutions, and advantages of the present disclosure more clear, the technical solutions of the present disclosure are clearly and completely described below with reference to the drawings of the embodiments of the present disclosure. The embodiments described in detail hereinafter make up only a subset of the embodiments contemplated in view of this disclosure. Based on the full scope of the present disclosure, all other embodiments obtained by those ordinary skilled in the art without carrying out inventive effort also fall within the protection scope of the present disclosure. It should be noted that throughout the drawings, the same elements are indicated by the same or similar reference signs. In the following description, some specific embodiments are provided as illustrative examples for descriptive purposes, and should not be construed as limiting the present disclosure. To simplify explanation, conventional structures or configurations may be omitted. It should be noted that the shape and dimensions of components in the figure do not necessarily reflect actual sizes and/or ratios, but merely illustrate the content of the embodiment of the present disclosure.

Unless otherwise defined, the technical or scientific terms used in the embodiments of the present disclosure should have the usual meanings understood by those skilled in the art. The words "first," "second," and the like used in the embodiments of the present disclosure do not indicate any order, quantity or importance, but are only used to distinguish different components.

In addition, in the description of the embodiments of the present disclosure, the term "electrically connected" may mean that two components are electrically connected directly, or that two components are electrically connected via one or more other components.

Transistors used in the embodiments of the present disclosure may all be thin film transistors or field effect transistors or other devices with the same characteristics. Since source and drain electrodes of the thin film transistor used here are symmetrical, the source and drain electrodes may be interchanged. In the following examples, the driving transistor is described as a P-type thin film transistor, and the other transistors are of the same or different type as or from the driving transistor according to the circuit design. Similarly, in other embodiments, the driving transistor may also be shown as an N-type thin film transistor.

Figure 1:
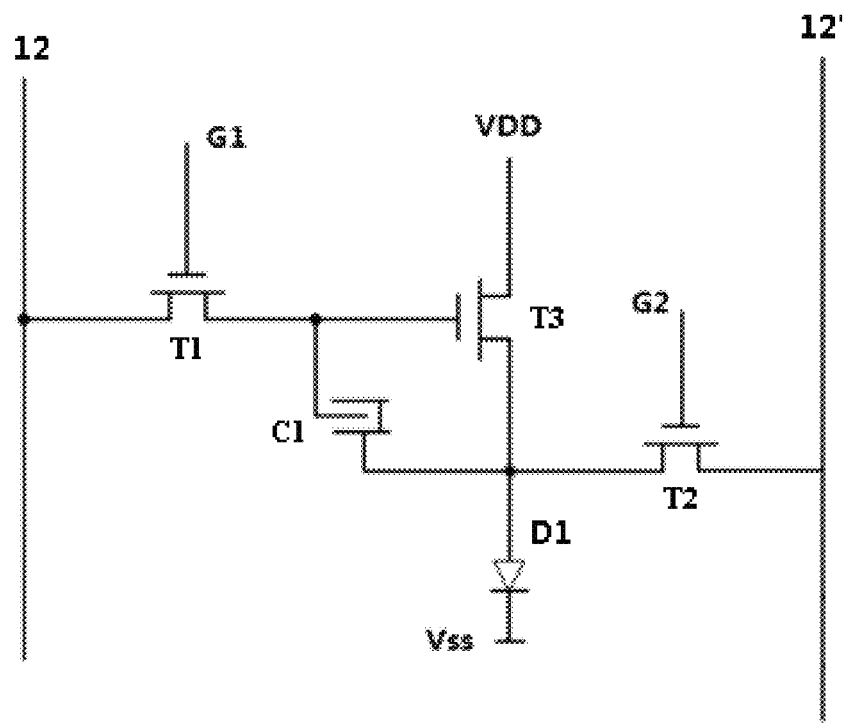
FIG. 1 shows a schematic diagram of an exemplary pixel driving circuit of a display panel.

FIG. 1 shows a schematic diagram of an exemplary pixel driving circuit of an OLED display panel. The pixel driving circuit includes a switching transistor T1, an induction transistor T2, a driving transistor T3, a storage capacitor C1, and other elements. The pixel driving circuit may be referred to as a 3T1C structure. One of a source electrode and a drain electrode of the switching transistor T1 is connected to a data line, and another of the source electrode and the drain electrode of the switching transistor T1 is connected to a gate electrode of the driving transistor T3. The switching transistor T1 is used to control writing of a voltage signal from a data line 12 to the pixel driving circuit. The storage capacitor C1 has both ends connected between the gate electrode of the driving transistor T3 and the source electrode of the driving transistor T3, so as to store the voltage signal input from the data line. A drain electrode of the driving transistor T3 may be connected to receive a certain DC voltage signal (such as a high voltage level signal VDD), and a source electrode of the driving transistor T3 may be connected to an anode electrode of a light-emitting element D1, so that a driving current may be generated according to the voltage signal to drive the light-emitting element D1 to emit light. In actual display, since a change of transistor characteristics may cause display abnormality, it is desirable that the pixel driving circuit has a certain compensation effect on the change of transistor characteristics. To this end, an induction line 12' may be provided to acquire detection signals that reflect the change of transistor characteristics, such as a voltage signal at the anode electrode of the light-emitting element D1. These detection signals may be used as a basis for compensating the pixel driving circuit. For example, the compensation may be achieved by adjusting a signal on the data line. The induction transistor T2 is used to control the induction line to acquire the detection signals. As an example, in the embodiments shown in FIG. 1, one of the source electrode of the induction transistor T2 and the drain electrode of the induction transistor T2 is connected to the induction line 12', and another of the source electrode of the induction transistor T2 and the drain electrode of the induction transistor T2 is connected to the anode electrode of the light-emitting element D1. The gate electrode of the switching transistor T1 and the gate electrode of the induction transistor T2 may be controlled respectively by specific signals such as G1 and G2 (for example, which are provided by different gate lines). VDD and VSS signals are both DC voltage signals, which are used to provide necessary voltages for driving the light-emitting element D1 to emit light. The data line 12 is used to input a data signal for controlling and driving the light-emitting element D1 to emit light. Here given is only an example of the pixel driving circuit.

Figure 2:
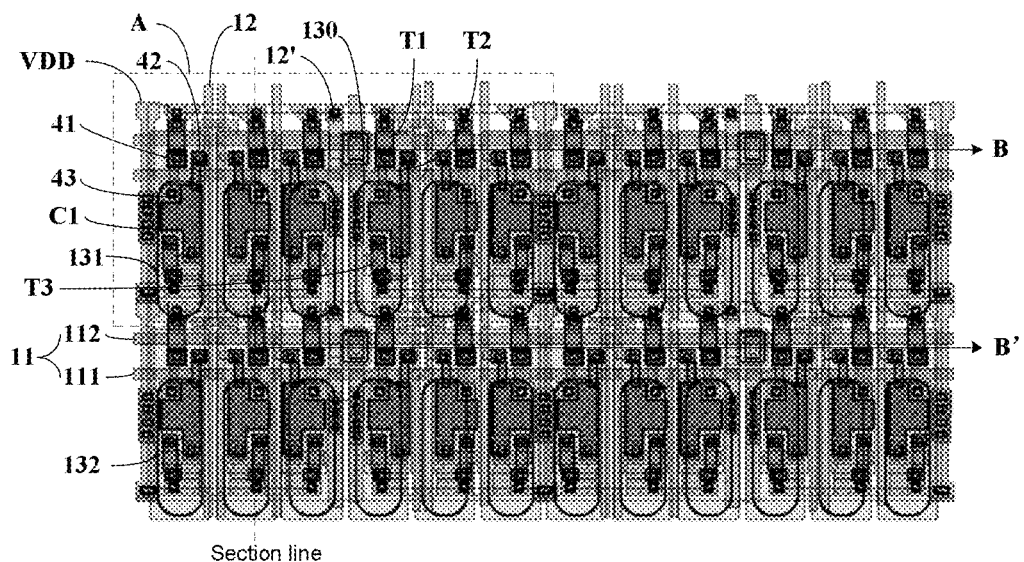
FIG. 2 shows a plan view of a display panel according to some embodiments of the present disclosure.
Figure 3:
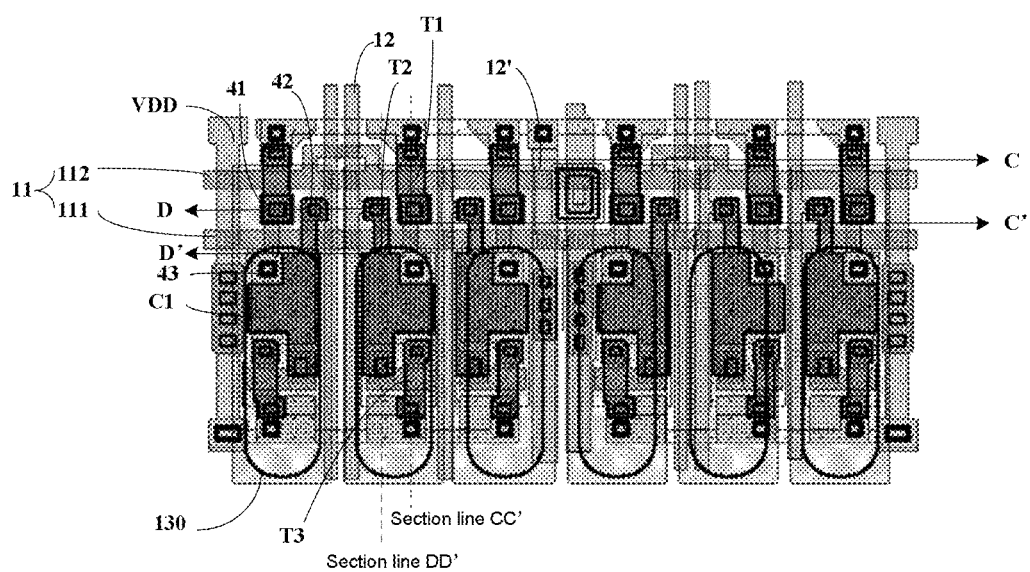
FIG. 3 schematically shows a partial enlarged view corresponding to an area shown by a dashed frame A in FIG. 2.
Figure 10:
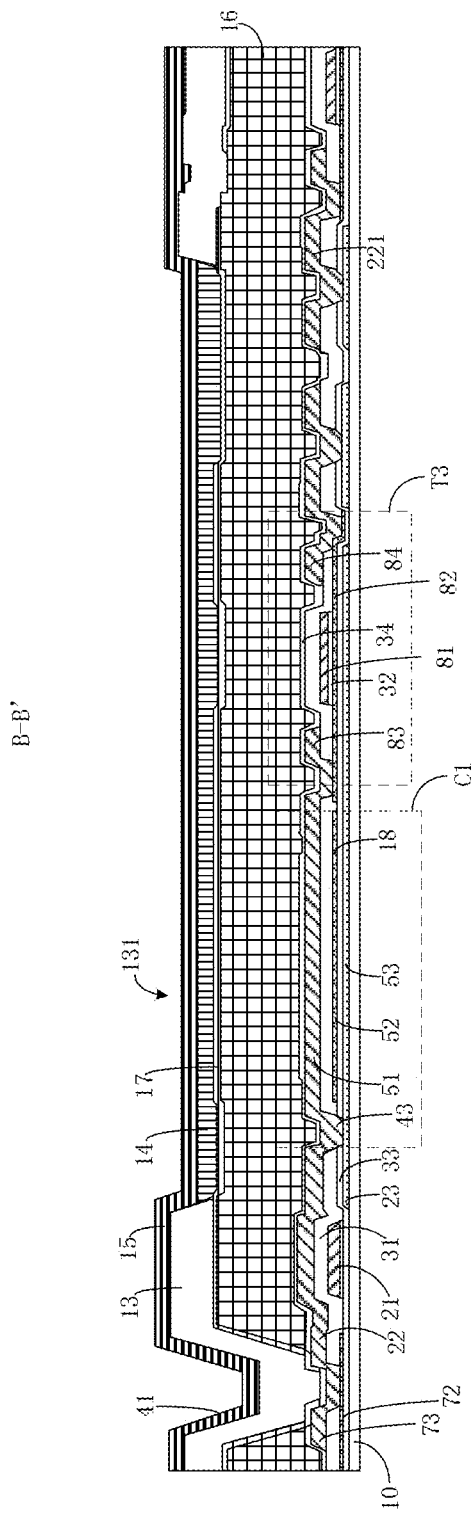
FIG. 10 schematically shows a cross-sectional view taken along line BB' in FIG. 2.

FIG. 2 shows a plan view of a display panel according to some embodiments of the present disclosure. FIG. 10 schematically shows a cross-sectional view taken along line BB' in FIG. 2 (a transverse position of section line BB' is shown by a vertical dashed line in FIG. 2). FIG. 3 schematically shows a partial enlarged view corresponding to an area shown by a dashed frame A in FIG. 2. As shown in FIG. 10, the display panel includes a base substrate 10 (for example, a glass substrate). As shown in FIG. 2, a plurality of gate lines 11 and a plurality of data lines 12 are provided on the base substrate 10. An orthographic projection of the plurality of gate lines 11 on the base substrate 10 overlaps an orthographic projection of the plurality of data lines 12 on the base substrate 10. The gate lines 11 and the data lines 12 may be located in different conductive layers.

As shown in FIG. 2, a plurality of sub-pixel units 20 are arranged on the base substrate 10. At least one of the plurality of sub-pixel units 20 includes a light-emitting element D1, a switching transistor T1, an induction transistor T2, a driving transistor T3, and a storage capacitor C1. In a same sub-pixel unit 20, an orthographic projection of the switching transistor T1 on the base substrate 10 and an orthographic projection of the induction transistor T2 on the base substrate 10 are located on a first side of an orthographic projection of the storage capacitor C1 on the base substrate 10, and an orthographic projection of the driving transistor T3 on the base substrate 10 is located on a second side of the orthographic projection of the storage capacitor C1 on the base substrate 10. The first side and the second side are opposite to each other in a direction extending along the data line 12. In the embodiment of FIG. 2, the first side of the orthographic projection of the storage capacitor C1 on the base substrate 10 is an upper side, and the second side of the orthographic projection of the storage capacitor C1 on the base substrate 10 is a lower side. In a layout of the display panel, a light-emitting material layer 14 is generally arranged on a side of electronic components such as the switching transistor T1, the induction transistor T2, the driving transistor T3 and the storage capacitor C1 away from the base substrate. The light-emitting material layer 14 is generally formed after formation of these structures. Therefore, a segment difference of structures between the light-emitting material layer 14 and the base substrate 10 may affect a thickness uniformity of the light-emitting material layer 14. For example, if film structures directly under the light-emitting material layer 14 have a large segment difference, the thickness uniformity of the light-emitting material layer 14 may be poor. As shown in FIG. 2, the switching transistor T1 and the induction transistor T2 are arranged on the same side of the storage capacitor C1, so that a larger flat area (a smaller segment difference) may be easily provided to the storage capacitor C1. The light-emitting material layer 14 may be formed as much as possible above the flat area, which is beneficial to improve the thickness uniformity of the light-emitting material layer 14. In design, it is desirable that gate lines and via holes (especially deep via holes, such as a first via structure 41 shown in FIG. 10) may be avoided as much as possible in an area where the light-emitting material layer 14 is located, and a structure with a flat top, such as the storage capacitor C1, may be arranged in the area where the light-emitting material layer 14 is located. The design of arranging the switching transistor T1 and the induction transistor T2 on a side of the storage capacitor C1 while arranging the driving transistor T3 on another side of the storage capacitor C1 is beneficial to achieve this objective.

In some embodiments, the switching transistor T1 includes a first gate electrode 61, a first active region 62, a first source electrode 63, and a first drain electrode 64. The induction transistor T2 includes a second gate electrode 71, a second active region 72, a second source electrode 73, and a second drain electrode 74. The driving transistor T3 includes a third gate electrode 81, a third active region 82, a third source electrode 83, and a third drain electrode 84. The storage capacitor C1 includes a first storage electrode portion 51 and a second storage electrode portion 52. The second storage electrode portion 52 is located on a side of the first storage electrode portion 51 facing the base substrate 10. In a direction perpendicular to the base substrate 10, a first insulating layer 31 (such as an interlayer dielectric layer or other insulating layers) is provided between the first storage electrode portion 51 and the second storage electrode portion 52. An orthographic projection of the first storage electrode portion 51 on the base substrate 10 at least partially overlaps an orthographic projection of the second storage electrode portion 52 on the base substrate 10. The light-emitting element D1 includes a cathode layer 15, an anode layer 17, and a light-emitting material layer 14 located between the cathode layer 15 and the anode layer 17 in the direction perpendicular to the base substrate 10. It should be noted that "a first insulating layer 31 is provided between the first storage electrode portion 51 and the second storage electrode portion 52" mentioned above does not mean that only one insulating layer may be provided between the first storage electrode portion 51 and the second storage electrode portion 52. In some embodiments, one or more insulating layers may be provided between the first storage electrode portion 51 and the second storage electrode portion 52. This may be set as desired, as long as the two storage electrode portions can be separated.

Figure 11:
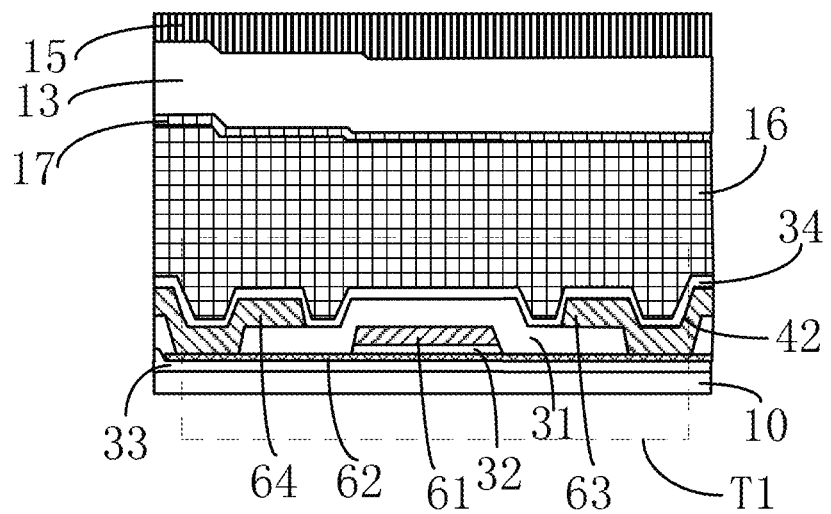
FIG. 11 schematically shows a cross-sectional view of a switching transistor of a display panel according to some embodiments of the present disclosure.
Figure 12:
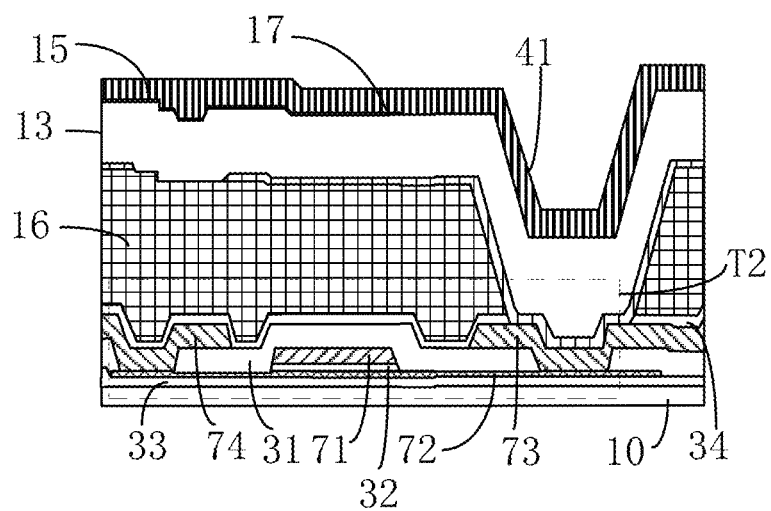
FIG. 12 schematically shows a cross-sectional view of an induction transistor of a display panel according to some embodiments of the present disclosure.

A cross-sectional view of the driving transistor T3 and a cross-sectional view of the storage capacitor C1 are clearly shown in FIG. 10, and a cross-sectional view of the switching transistor T1 and a cross-sectional view of the induction transistor T2 are respectively shown in FIG. 11 and FIG. 12. FIG. 11 shows a cross-sectional view taken along line DD' in FIG. 3. FIG. 12 shows a cross-sectional view taken along line CC' in FIG. 3. As an example, in a same sub-pixel unit 20, one of the first source electrode 63 of the switching transistor T1 and the first drain electrode 64 of the switching transistor T1 is electrically connected to the data line 12, and another of the first source electrode 63 of the switching transistor T1 and the first drain electrode 64 of the switching transistor T1 is electrically connected to the second storage electrode portion 52. The third gate electrode 81 of the driving transistor T3 is electrically connected to the second storage electrode portion 52, the third source electrode 83 of the driving transistor T3 is electrically connected to the first storage electrode portion 51, and the third drain electrode 84 of the driving transistor T3 is electrically connected to the high voltage level signal VDD. One of the second source electrode 73 of the induction transistor T2 and the second drain electrode 74 of the induction transistor T2 is electrically connected to the first storage electrode portion 51, and another of the second source electrode 73 of the induction transistor T2 and the second drain electrode 74 of the induction transistor T2 is electrically connected to an induction line 12' on the base substrate 10. The first storage electrode portion 51 is electrically connected to the anode layer 17 of the light-emitting element D1.

The display panel may further include a pixel defining layer 13 and a light-emitting material layer 14. The pixel defining layer 13 is located on a side of the gate lines 11 and the data lines 12 away from the base substrate 10. The pixel defining layer 13 includes a plurality of hollow portions 130, and the light-emitting material layer 14 is arranged in the plurality of hollow portions 130 of the pixel defining layer 13. Because the gate lines 11 and the data lines 12 are arranged in different layers, at an overlapping portion of the gate lines 11 and the data lines 12, a large segment difference may be generated in a functional layer above the layer where the gate lines 11 are located and the layer where the data lines 12 are located (that is, the side away from the base substrate 10) due to overlapping of the gate lines 11 and the data lines 12. As mentioned above, the light-emitting material layer 14 is located on the side of the layer where the gate lines 11 are located and the layer where the data lines 12 are located away from the base substrate 10. Therefore, when the light-emitting material layer 14 overlaps the gate lines 11 (the orthographic projection of the gate lines 11 on the base substrate 10 overlaps the orthographic projection of the light-emitting material layer 14 on the base substrate 10), the light-emitting material layer 14 may have a large segment difference accordingly, which may affect the thickness uniformity of the light-emitting material layer 14. Especially for a light-emitting material layer formed by a printing process, such thickness non-uniformity has more obvious influence on the display effect. This is because the light-emitting material layer formed by the printing process is thinner than the light-emitting material layer formed by an evaporation process.

In some existing display panels, the orthographic projection of the gate lines 11 on the base substrate 10 often crosses the orthographic projection of the light-emitting material layer 14 on the base substrate 10. Therefore, the orthographic projection of the gate lines 11 on the base substrate 10 and the orthographic projection of the light-emitting material layer 14 on the base substrate 10 often have a large overlapping area, which may cause the thickness non-uniformity of the light-emitting material layer 14, resulting in defects such as mura effect clouding. Especially in a large-dimension display panel (such as a display panel used in a LCD TV), this influence may be more obvious because a thickness of the layers where the gate lines 11 and the data lines 12 are respectively located is generally much larger than a thickness of the light-emitting material layer 14. In the embodiments of the present disclosure, the orthographic projection of the gate lines 11 on the base substrate 10 does not overlap the orthographic projection of the light-emitting material layer 14 on the base substrate 10. This may prevent a negative effect of the segment difference of the gate lines 11 on the thickness uniformity of the light-emitting material layer 14.

Specifically, in the example shown in FIG. 2, the gate lines 11 on the display panel include a first gate line 111 and a second gate line 112. The first gate line 111 and the second gate line 112 are adjacent to each other. An orthographic projection of the first gate line 111 on the base substrate 10 and an orthographic projection of the second gate line 112 on the base substrate 10 are both located between orthographic projections of two adjacent hollow portions 130 of the pixel defining layer 13 on the base substrate 10. Therefore, the orthographic projection of the first gate line 111 on the base substrate 10 and the orthographic projection of the second gate line 112 on the base substrate 10 do not overlap the orthographic projection of the light-emitting material layer 14 on the base substrate 10. This may prevent the light-emitting material layer 14 from being affected by the segment difference caused by the overlapping of the gate lines 11 and the data lines 12. Here, "the first gate line 111 and the second gate line 112 are adjacent to each other" does not limit that the first gate line 111 and the second gate line 112 are closely attached to each other, but refers to that no other gate lines are arranged between the first gate line 111 and the second gate line 112. A structure in which two gate lines are arranged side by side between two adjacent hollow portions 130 is different from a structure in a related art. In the related art, if a row of pixels corresponds to two gate lines (that is, in a case of a double-gate line structure), at least one of the gate lines is generally arranged to overlap the light-emitting material layer 14. In order to further reduce the influence of other structures (such as the via structure) on the thickness uniformity of the light-emitting material layer 14, a structure that may cause a segment difference, such as the via structure (for example, a via structure passing through the planarization layer close to the light-emitting material layer 14), may also be arranged between two adjacent hollow portions 130, for example, between the first gate line 111 and the second gate line 112 adjacent to each other, so as to further improve the thickness uniformity of the light-emitting material layer 14. In some embodiments, each hollow portion 130 in the pixel defining layer 13 may correspond to a sub-pixel of the display panel.

In some embodiments, the first gate electrode 61 of the switching transistor T1 is electrically connected to the first gate line 111 (for example, which provides the signal G1), and the second gate electrode 71 of the induction transistor T2 is electrically connected to the second gate line 112 (for example, which provides the signal G2). The design of arranging the first gate line 111 associated with the switching transistor T1 and the second gate line 112 associated with the induction transistor T2 to be adjacent to each other is advantageous for optimizing the layout, and is particularly advantageous for arranging the first via structure 41 passing through the planarization layer 16 to be away from the storage capacitor C1.

In some embodiments, the display panel may further include: a first metal layer 21 (for example, a gate layer), a first insulating layer 31 (for example, an interlayer dielectric layer) and a second metal layer 22 (for example, a source and drain layer) located on the base substrate 10. The first insulating layer 31 is located on a side of the first metal layer 21 away from the base substrate 10, and the second metal layer 22 is located on a side of the first insulating layer 31 away from the base substrate 10. The plurality of gate lines 11 may be arranged in the first metal layer 21, and the plurality of data lines 12 may be arranged in the second metal layer 22.

In order to better compensate for the segment difference caused by the overlapping of the gate lines 11 and the data lines 12, a pad portion 221 (or called a pad layer) may be further provided. A thickness of the pad portion 221 may compensate for the segment difference described above. As an example, the pad portion 221 may be arranged in the second metal layer 22. That is, the pad portion 221 may be arranged in a same layer as the plurality of data lines 12. In this way, it may be easily ensured that the pad portion 221 and the data lines 12 have a same thickness, so as to ensure the compensation effect on the segment difference. This may also enable the pad portion 221 and the data lines 12 to be formed in a same process step, so as to avoid a process complexity.

Figure 8:
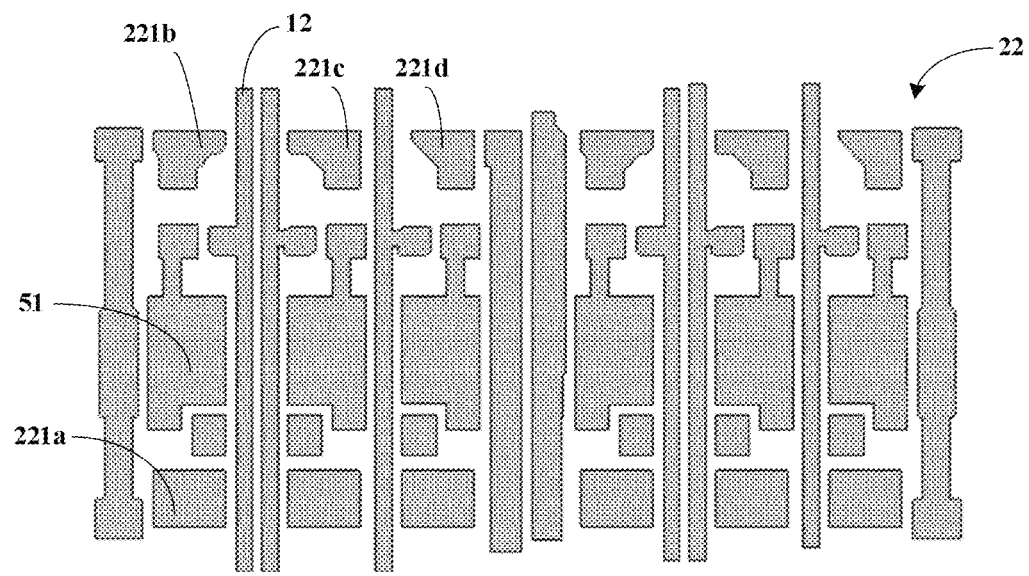
FIG. 8 shows a schematic diagram of a structure distribution in a second metal layer of the display panel shown in FIG. 3.

In some embodiments, an orthographic projection of the pad portion 221 on the base substrate 10 may at least partially overlap the orthographic projection of the light-emitting material layer 14 on the base substrate. This may ensure that the light-emitting material layer 14 may be padded to obtain the effect of compensating for the segment difference. In the embodiments of the present disclosure, the orthographic projection of the pad portion 221 on the base substrate 10 may have various shapes, and the specific shape may be designed according to layout requirements for the display panel. FIG. 8 shows a schematic diagram of the second metal layer 22. In the second metal layer 22 in FIG. 8, pad portions 221a, 221b, 221c and 221d of various shapes are shown. For example, each of the pad portions 221b, 221c and 221d may have a corner portion so as to avoid patterns designed in other film layers.

In some embodiments, the pad portion 221 has a thickness of 80 nanometers to 120 nanometers. However, the thickness of the pad portion 221 is not limited to this range. An actual thickness of the pad portion 221 may also be determined according to requirements (for example, a required thickness of the first metal layer or the second metal layer).

In some embodiments, as described above, the plurality of hollow portions 130 in the pixel defining layer 13 include a first hollow portion 131 and a second hollow portion 132 adjacent to each other (such as the first hollow portion 131 and the second hollow portion 132 adjacent to each other in an extension direction of the data lines 12). The orthographic projection of the first gate line 111 on the base substrate 10 and the orthographic projection of the second gate line 112 on the base substrate 10 are located between an orthographic projection of the first hollow portion 131 on the base substrate 10 and an orthographic projection of the second hollow portion 132 on the base substrate 10. Here, "a first hollow portion 131 and a second hollow portion 132 adjacent to each other" does not limit that the first hollow portion 131 and the second hollow portion 132 are closely attached to each other, but refers to that no other hollow portions 130 are arranged between the first hollow portion 131 and the second hollow portion 132.

In some embodiments, the first gate electrode 61, the second gate electrode 71 and the third gate electrode 81 are arranged in the first metal layer 21, and the first source electrode 63, the first drain electrode 64, the second source electrode 73, the second drain electrode 74, the third source electrode 83, the third drain electrode 84, the first storage electrode portion 51, and the induction line 12' are arranged in the second metal layer 22. The display panel further includes an active layer 18 (for example, a polysilicon layer) located on a side of the first metal layer 21 facing the base substrate 10. The first active region 62, the second active region 72, the third active region 82, and the second storage electrode portion 52 are arranged in the active layer 18.

In some embodiments, the display panel may further include a planarization layer 16 and a first via structure 41. The planarization layer 16 may be located on a side of the second metal layer 22 away from the base substrate 10 and on a side of the pixel defining layer 13 facing the base substrate 10. That is, the planarization layer 16 is located between the second metal layer 22 and the pixel defining layer 13 in the direction perpendicular to the base substrate 10. The anode layer 17 is located on a side of the planarization layer 16 away from the base substrate 10 and on the side of the pixel defining layer 13 facing the base substrate. That is, the anode layer 17 is located between the planarization layer 16 and the pixel defining layer 13 in the direction perpendicular to the base substrate 10. The planarization layer 16 is generally a thick insulating layer (for example, a resin layer) and is arranged close to the light-emitting material layer 14 (there is generally only a thin anode layer 17 between the planarization layer 16 and the light-emitting material layer 14). The planarization layer 16 may provide a flat base surface for the light-emitting material layer 14 so as to ensure that the light-emitting material layer 14 has a uniform thickness.

The via structure passing through the planarization layer 16, such as the first via structure 41 described above, may damage a flat surface of the planarization layer 16. The first via structure 41 passes through the planarization layer 16, so that the anode layer 17 is electrically connected to the first storage electrode portion 51 in the second metal layer 22. As shown in FIG. 10, the first via structure 41 damages the flatness of the planarization layer 16. Therefore, in order to ensure that a portion of the planarization layer 16 directly facing the light-emitting material layer 14 is not affected by the first via structure 41 so as to ensure the uniform thickness of the light-emitting material layer 14, a position of the first via structure 41 may be staggered from the light-emitting material layer 14. The position of the first via structure 41 may be designed so that an orthographic projection of the first via structure 41 on the base substrate 10 does not overlap the orthographic projection of the plurality of hollow portions 130 of the pixel defining layer 13 on the base substrate 10.

For example, in the embodiments shown in FIG. 2 and FIG. 3, the orthographic projection of the first via structure 41 on the base substrate 10 is located between the orthographic projection of the first gate line 111 on the base substrate 10 and the orthographic projection of the second gate line 112 on the base substrate 10. With such arrangement, on the one hand, the first via structure 41 may avoid the light-emitting material layer 14 so as to prevent the segment difference caused by the first via structure 41 from affecting the thickness uniformity of the light-emitting material layer 14. On the other hand, the first gate line 111 and the second gate line 112 adjacent to each other may be spaced apart to reduce a mutual influence between the first gate line 111 and the second gate line 112.

It should be noted that the second metal layer 22 is closer to the planarization layer 16 than the first metal layer 21, and thus it is more advantageous to provide the pad portion 221 in the second metal layer 22 than in the first metal layer 21. This may avoid changing the film structure between the first metal layer 21 and the second metal layer 22 due to the arrangement of the pad portion 221, and is also more conducive to ensuring the flatness of a surface of the planarization layer 16 on a side close to the light-emitting material layer 14. In some embodiments, the display panel may further include a second insulating layer 32 (for example, a gate insulating layer) and a second via structure 42. The active layer 18 may be located on the side of the first metal layer 21 facing the base substrate 10. The second insulating layer 32 may be located on a side of the active layer 18 away from the base substrate 10 and on a side of the first metal layer 21 facing the base substrate 10. The second via structure 42 may pass through the first insulating layer 31 and the second insulating layer 32, so that the first active region 62 of the switching transistor T1 may be connected to the first source electrode 63 of the switching transistor T1 or the first drain electrode 64 of the switching transistor T1.

Figure 4:
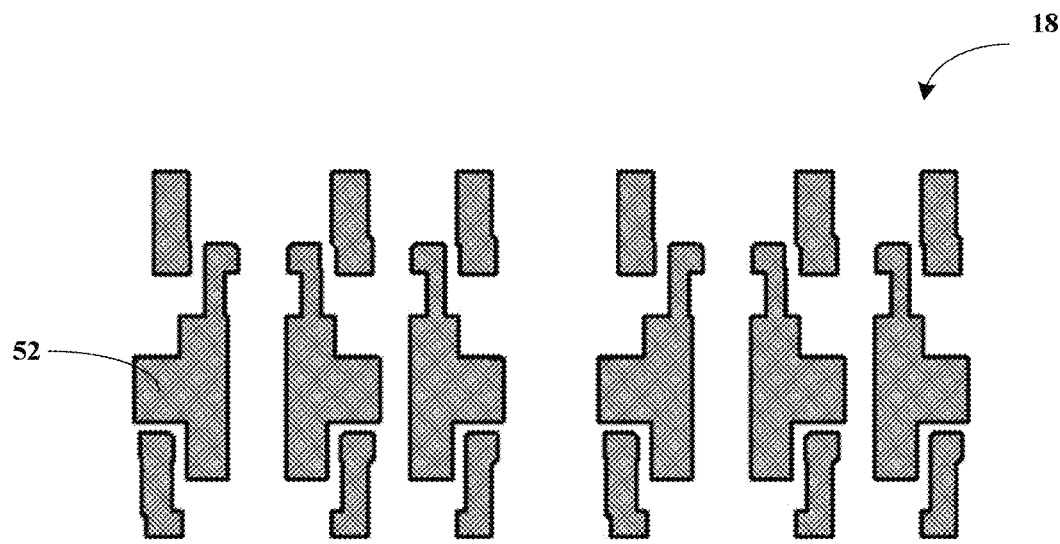
FIG. 4 shows a schematic diagram of a structure distribution in an active layer of the display panel shown in FIG. 3.
Figure 5:
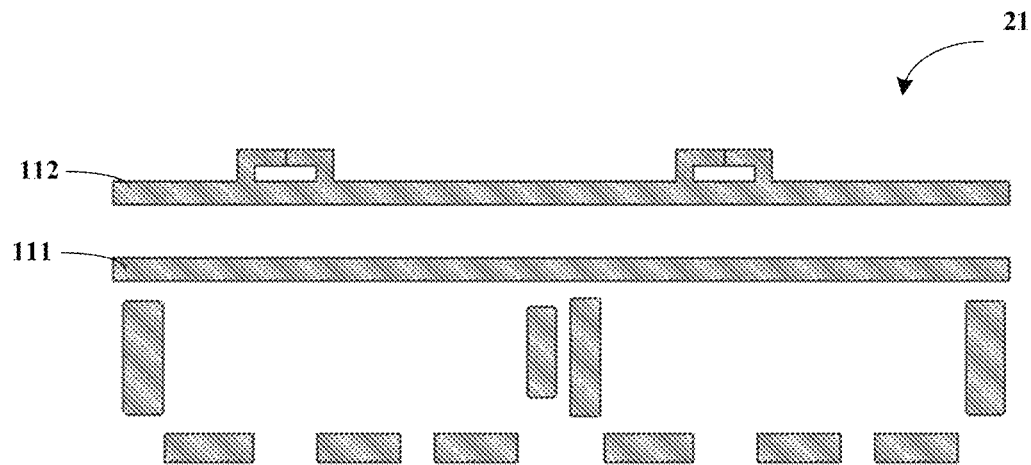
FIG. 5 shows a schematic diagram of a structure distribution in a first metal layer of the display panel shown in FIG. 3.
Figure 6:
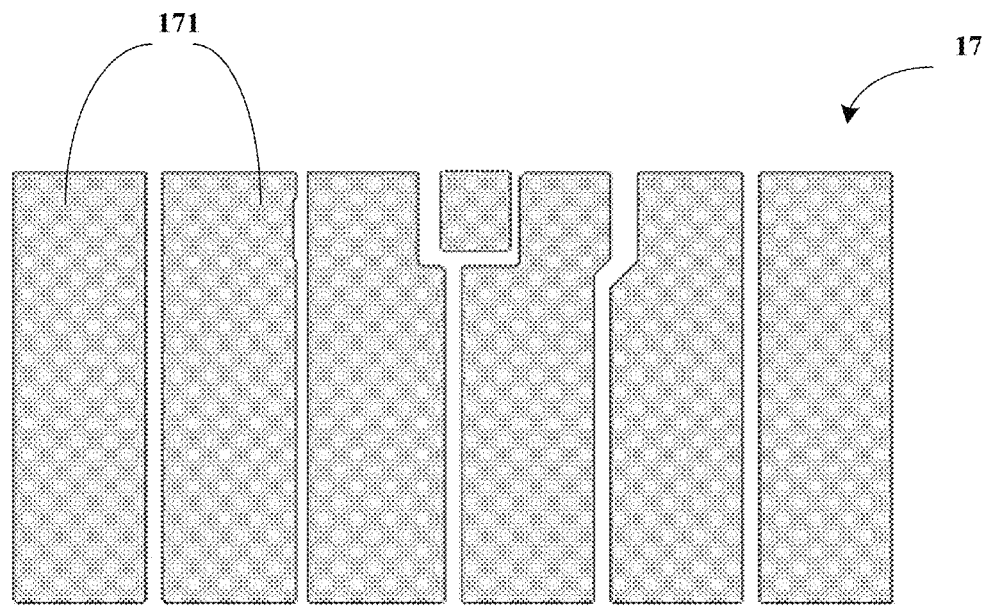
FIG. 6 shows a schematic diagram of a structure distribution in an anode layer of the display panel shown in FIG. 3.
Figure 7:
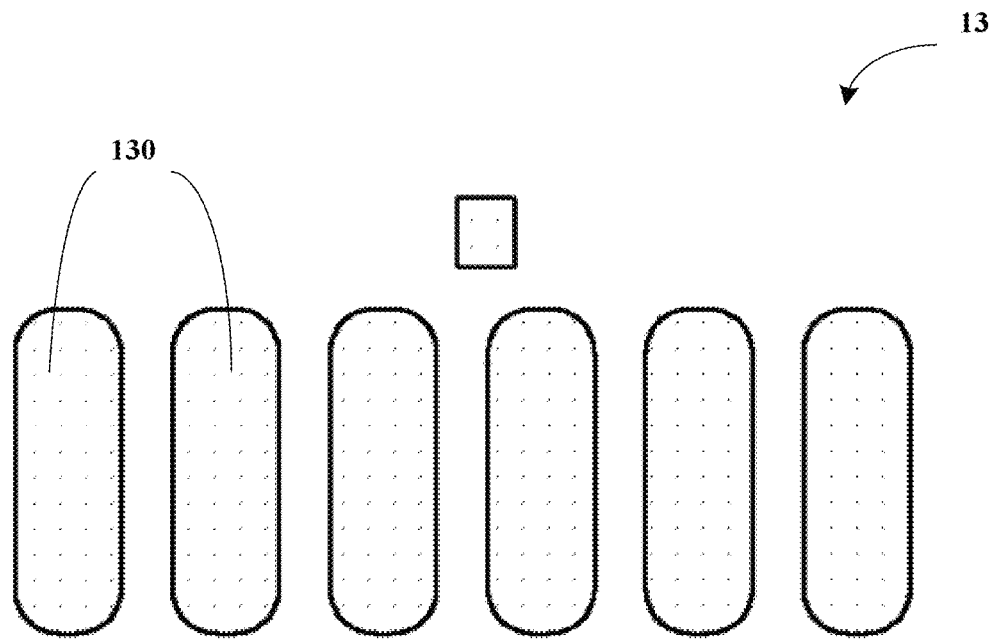
FIG. 7 shows a schematic diagram of a structure distribution in a pixel defining layer of the display panel shown in FIG. 3.
Figure 9:
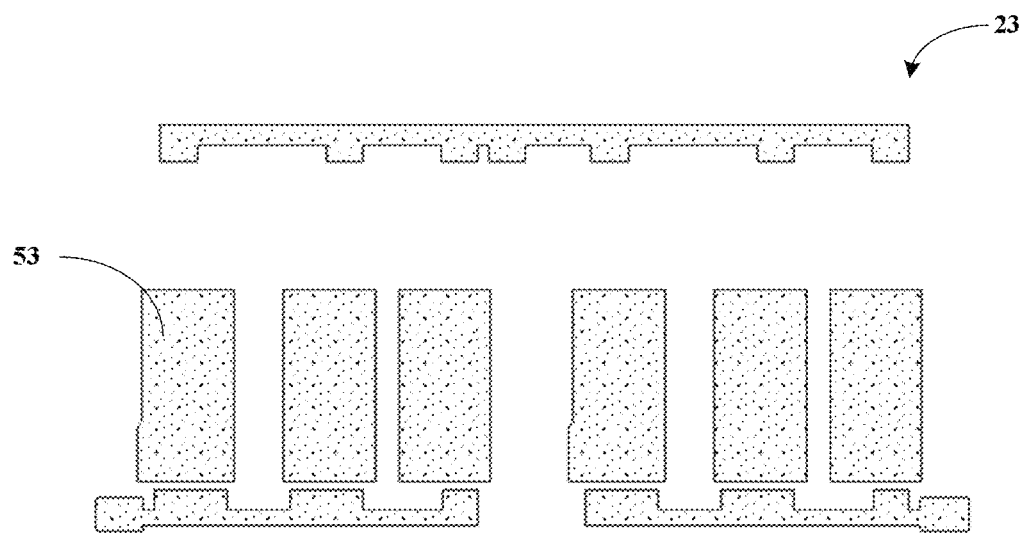
FIG. 9 shows a schematic diagram of a structure distribution in a third metal layer of the display panel shown in FIG. 3.

FIG. 4 shows an exemplary distribution of patterns in the active layer 18. FIG. 5 shows an exemplary distribution of patterns in the first metal layer 21. It should be noted that although the first gate line 111 and the second gate line 112 are arranged in the first metal layer 21, other structures, such as a gate electrode, a storage electrode, etc., may be further provided in the first metal layer 21. These structures have little influence on the segment difference. Although the orthographic projection of the gate lines 11 on the base substrate 10 is arranged not to overlap the orthographic projection of the light-emitting material layer 14 on the base substrate 10, this does not mean that all parts in the first metal layer 21 do not overlap the light-emitting material layer 14. In some embodiments, especially for those structures that have little influence on the segment difference, they may be arranged to have an overlapping area with the light-emitting material layer 14. FIG. 7 shows an exemplary distribution of patterns in the pixel defining layer 13. The plurality of hollow portions 130 in the pixel defining layer 13 are shown in FIG. 7. FIG. 6 shows an exemplary distribution of patterns in the anode layer 17. A plurality of separated anode portions 171 are shown in FIG. 6. These anode portions 171 respectively correspond to the hollow portions 130 in the pixel defining layer 13, so as to apply voltages respectively to the light-emitting material layer 14 located at the hollow portions 130. FIG. 9 shows an exemplary distribution of patterns in a third metal layer 23. The third metal layer 23 may be used as, for example, a light-shielding layer, for shielding some elements that may be easily affected by external light (for example, a polysilicon layer of a thin film transistor), and the like.

The second via structure 42 may also cause a segment difference. Therefore, it is also desirable that a position of the second via structure 42 may avoid the light-emitting material layer 14. For example, the second via structure 42 may be arranged so that the orthographic projection of the second via structure 42 on the base substrate 10 does not overlap the orthographic projections of the plurality of hollow portions 130 of the pixel defining layer 13 on the base substrate 10. In the embodiments shown in FIG. 2 and FIG. 3, the orthographic projection of the first via structure 42 on the base substrate 10 may be located between the orthographic projection of the first gate line 111 on the base substrate 10 and the orthographic projection of the second gate line 112 on the base substrate 10. Similar to the first via structure 41 described above, the second via structure 42 may also be arranged in a spacer region between the first gate line 111 and the second gate line 112. It should be noted that since a thickness of film layers that the second via structure 42 passes through is significantly smaller than that of film layers that the first via structure 41 passes through, the segment difference caused by the second via structure 42 has a smaller influence on the light-emitting material layer 14 than that caused by the first via structure 41. In some other embodiments of the present disclosure, the orthographic projection of the second via structure 42 on the base substrate 10 may also be arranged to overlap the orthographic projection of the light-emitting material layer 14 on the base substrate 10.

In some embodiments, the storage capacitor C1 may further include a third storage electrode portion 53. The first storage electrode portion 51 is provided in the second metal layer 22. The second storage electrode portion 52 is provided in the active layer 18. The third storage electrode portion 53 is provided in the third metal layer 23 located on a side of the active layer 18 facing the base substrate 10. The orthographic projection of the first storage electrode portion 51 on the base substrate 10 at least partially overlaps the orthographic projection of the second storage electrode portion 52 on the base substrate 10, and an orthographic projection of the third storage electrode portion 53 on the base substrate 10 at least partially overlaps the orthographic projection of the second storage electrode portion 52 on the base substrate 10. As described above, in this embodiment, the storage capacitor C1 has a three-layer structure of storage electrode portions, and the three storage electrode portions are located in the second metal layer 22, the active layer 18 and the third metal layer 23, respectively. It should be noted that some parts of the active layer 18 may have conductive properties by conducting treatment such as doping, but not all parts of the active layer 18 have semiconductor properties. Here, the second storage electrode portion 52 located in the active layer 18 has conductive properties.

In the structure of the storage capacitor C1 described above, the second storage electrode portion 52 located in the active layer 18 may form storage capacitors with the first storage electrode portion 51 in the second metal layer 22 and the third storage electrode portion 53 in the third metal layer 23, respectively. Therefore, the three-layer structure described above may be regarded as a parallel connection of two storage capacitors to form a larger storage capacitor. In this way, an area of the orthographic projection of the storage capacitor on the base substrate 10 may be reduced, so that a wiring space of the display panel may be saved, and a parasitic capacitance may be reduced.

In some embodiments, the display panel may further include a third insulating layer 33 (for example, a buffer layer). The third insulating layer 33 is located on a side of the third metal layer 23 away from the base substrate 10 and on a side of the active layer 18 facing the base substrate 10. The storage capacitor C1 further includes a third via structure 43. The third via structure 43 passes through the first insulating layer 31, the second insulating layer 32 and the third insulating layer 33, so that the third storage electrode portion 53 is electrically connected to the first storage electrode portion 51. By connecting the third storage electrode portion 53 and the first storage electrode portion 51 through the third via structure 43, the capacitor parallel effect described above may be achieved. In this way, both an overlapping area of the third storage electrode portion 53 and the second storage electrode portion 52 and an overlapping area of the first storage electrode portion 51 and the second storage electrode portion 52 may be used to store a capacitance value of the storage capacitor C1.

In addition, since the three storage electrode portions of the storage capacitor C1 are easy to form good flatness to reduce the segment difference between the film layers, the overlapping between the three storage electrode portions of the storage capacitor C1 and the light-emitting material layer 14 is advantageous for reducing the influence of the segment difference on the light-emitting material layer 14. In some embodiments, each of the orthographic projection of the first storage electrode portion 51 of the storage capacitor C1 on the base substrate 10, the orthographic projection of the second storage electrode portion 52 of the storage capacitor C1 on the base substrate 10, and the orthographic projection of the third storage electrode portion 53 of the storage capacitor C1 on the base substrate 10 at least partially overlaps the orthographic projection of the hollow portions 130 of the pixel defining layer 13 on the base substrate 10.

As an example, at least 70% of an area of each of the orthographic projection of the first storage electrode portion 51 of the storage capacitor C1 on the base substrate 10, the orthographic projection of the second storage electrode portion 52 of the storage capacitor C2 on the base substrate 10 and the orthographic projection of the third storage electrode portion 53 of the storage capacitor C1 on the base substrate 10 falls within the orthographic projection of the hollow portions 130 of the pixel defining layer 13 on the base substrate 10.

In some embodiments, the cathode layer 15 is located on a side of the light-emitting material layer 14 away from the base substrate 10. The light-emitting material layer 14 is located between the anode layer 17 and the cathode layer 15. When a high voltage level signal and a low voltage level signal are respectively applied to the anode layer 17 and the cathode layer 15, the light-emitting material layer 14 may emit light under an excitation of a voltage difference between the high voltage level signal and the low voltage level signal. The cathode layer 15 may be arranged to be at least partially light-transmissive, so that excitation light may be emitted from the cathode layer 15 when the light-emitting material layer 14 is excited.

As an example, a lead wire of the high voltage level signal (VDD) and the low voltage level signal (VSS) may be provided in the second metal layer 22 or in the third metal layer 23.

In the embodiments of the present disclosure, a thickness of the third metal layer 23 may be, for example, 2000 angstroms to 5000 angstroms. The third metal layer 23 may be made of, for example, a metal such as molybdenum. The cathode layer 15 may be made of, for example, a metal material such as silver or aluminum, and may have a thickness of 1000 nm, for example. The anode layer 17 may be made of, for example, silver, indium tin oxide (ITO), and the like. The insulating layer may be made of, for example, silicon oxide.

In the embodiments of the present disclosure, other film layers may be further provided in the display panel. For example, a fourth insulating layer 34 (for example, a protective layer or a passivation layer) may be provided on a side of the second metal layer 22 away from the base substrate 10 and on a side of the planarization layer 16 facing the base substrate 10.

Although the OLED display panel is illustrated by way of example in the embodiments of the present disclosure, those skilled in the art should understand that the embodiments of the present disclosure are not limited thereto. For example, a technical concept of the present disclosure may also be used for other types of display panels.

The various insulating layer structures described in the embodiments of the present disclosure are not limited to a single-layer structure, and each may include one or more sub-insulating layers. This may be set according to actual requirements.

The present disclosure further provides an electronic device, including the display panel according to any one of the embodiments described above. The electronic device may be any electronic device with a display function, such as a TV, a mobile phone, a monitor, a tablet computer, a notebook computer, a navigator, a digital photo frame, and so on. In addition, it should be clear to those skilled in the art that the electronic device according to the embodiments of the present disclosure is not limited to the above examples.

Unless there are technical obstacles or contradictions, the various embodiments of the present disclosure described above may be freely combined to form additional embodiments, and these additional embodiments are all within the protection scope of the present disclosure.

Although the present disclosure is described with reference to the drawings, the embodiments disclosed in the drawings are for illustrative purposes only and are not to be construed as limiting the present disclosure.

Although the present disclosure has been described with reference to several typical embodiments, it should be understood that the terms used are illustrative and exemplary rather than restrictive. Since the present disclosure may be implemented in various forms without departing from the spirit or essence of the present disclosure, it should be understood that the above-mentioned embodiments are not limited to any of the foregoing details, but should be interpreted broadly within the spirit and scope defined by the appended claims. Therefore, all changes and modifications falling within the scope of the claims or their equivalents shall be covered by the appended claims.

What is claimed is:

1. A display panel, comprising:
a base substrate;
a plurality of gate lines and a plurality of data lines located on the base substrate, wherein an orthographic projection of the plurality of gate lines on the base substrate overlaps an orthographic projection of the plurality of data lines on the base substrate; and
a plurality of sub-pixel units located on the base substrate, wherein at least a sub-pixel unit of the plurality of sub-pixel units comprises a light-emitting element, a switching transistor, an induction transistor, a driving transistor, and a storage capacitor,
wherein, in the sub-pixel unit:
an orthographic projection of the switching transistor on the base substrate and an orthographic projection of the induction transistor on the base substrate are located on a first side of an orthographic projection of the storage capacitor on the base substrate,
an orthographic projection of the driving transistor on the base substrate is located on a second side of the orthographic projection of the storage capacitor on the base substrate, and
the first side and the second side are opposite to each other in a direction extending along the plurality of data line;
wherein the switching transistor comprises a first gate electrode, a first active region, a first source electrode, and a first drain electrode;
wherein the induction transistor comprises a second gate electrode, a second active region, a second source electrode and a second drain electrode;
wherein the driving transistor comprises a third gate electrode, a third active region, a third source electrode and a third drain electrode;
wherein the storage capacitor comprises a first storage electrode portion and a second storage electrode portion located on a side of the first storage electrode portion facing the base substrate, a first insulating layer is provided between the first storage electrode portion and the second storage electrode portion in a direction perpendicular to the base substrate, an orthographic projection of the first storage electrode portion on the base substrate at least partially overlaps an orthographic projection of the second storage electrode portion on the base substrate;
wherein the light-emitting element comprises a cathode layer, an anode layer, and a light-emitting material layer located between the cathode layer and the anode layer in the direction perpendicular to the base substrate;
wherein in the sub-pixel unit:
one of the first source electrode or the first drain electrode of the switching transistor is electrically connected to the data line, and the other of the first source electrode or the first drain electrode of the switching transistor is electrically connected to the second storage electrode portion;
the third gate electrode of the driving transistor is electrically connected to the second storage electrode portion, the third source electrode of the driving transistor is electrically connected to the first storage electrode portion, and the third drain electrode of the driving transistor is electrically connected to a high voltage level signal;
one of the second source electrode or the second drain electrode of the induction transistor is electrically connected to the first storage electrode portion, and the other of the second source electrode or the second drain electrode of the induction transistor is electrically connected to an induction line on the base substrate; and
the first storage electrode portion is electrically connected to the anode layer of the light-emitting element;
wherein the display panel further comprises:
a pixel defining layer located on a side of the plurality of gate lines and the plurality of data lines away from the base substrate, wherein the pixel defining layer comprises a plurality of hollow portions, and the light-emitting material layer is arranged in the plurality of hollow portions of the pixel defining layer, and wherein the orthographic projection of the plurality of gate lines on the base substrate does not overlap an orthographic projection of the light-emitting material layer on the base substrate;
a first metal layer located on the base substrate, wherein the plurality of gate lines are arranged in the first metal layer; and
a second metal layer located on a side of the first metal layer away from the base substrate, wherein the plurality of data lines are arranged in the second metal layer, wherein the first insulating layer is located between the first metal layer and the second metal layer in the direction perpendicular to the base substrate, and a pad portion is further provided in the second metal layer, an orthographic projection of the pad portion on the base substrate at least partially overlaps the orthographic projection of the light-emitting material layer on the base substrate;
wherein the plurality of hollow portions in the pixel defining layer comprise a first hollow portion and a second hollow portion adjacent to each other, the plurality of gate lines comprise a first gate line and a second gate line adjacent to each other, an orthographic projection of the first gate line on the base substrate and an orthographic projection of the second gate line on the base substrate are located between an orthographic projection of the first hollow portion on the base substrate and an orthographic projection of the second hollow portion on the base substrate; and
wherein the display panel further comprises:
a planarization layer located on a side of the second metal layer away from the base substrate and on a side of the pixel defining layer facing the base substrate, wherein the anode layer is located on a side of the planarization layer away from the base substrate and on the side of the pixel defining layer facing the base substrate; and
a first via structure that passes through the planarization layer, so that the anode layer is electrically connected to the first storage electrode portion through the first via structure;
wherein an orthographic projection of the first via structure on the base substrate does not overlap an orthographic projection of the plurality of hollow portions of the pixel defining layer on the base substrate; and
wherein the orthographic projection of the first via structure on the base substrate is located between the orthographic projection of the first gate line on the base substrate and the orthographic projection of the second gate line on the base substrate.

2. The display panel of claim 1, wherein the first gate electrode of the switching transistor is electrically connected to the first gate line, and the second gate electrode of the induction transistor is electrically connected to the second gate line.

3. The display panel of claim 1, wherein the first gate electrode, the second gate electrode and the third gate electrode are arranged in the first metal layer;
wherein the first source electrode, the first drain electrode, the second source electrode, the second drain electrode, the third source electrode, the third drain electrode, the first storage electrode portion and the induction line are arranged in the second metal layer; and
wherein the display panel further comprises an active layer located on a side of the first metal layer facing the base substrate, and the first active region, the second active region, the third active region and the second storage electrode portion are arranged in the active layer.

4. The display panel of claim 1, further comprising:
a second insulating layer located on a side of the active layer away from the base substrate and on a side of the first metal layer facing the base substrate; and a second via structure that passes through the first insulating layer and the second insulating layer, so that the first active region of the switching transistor is electrically connected to the first source electrode or the first drain electrode of the switching transistor through the second via structure.

5. The display panel of claim 4, wherein an orthographic projection of the second via structure on the base substrate does not overlap the orthographic projection of the plurality of hollow portions of the pixel defining layer on the base substrate.

6. The display panel of claim 5, wherein the orthographic projection of the second via structure on the base substrate is located between the orthographic projection of the first gate line on the base substrate and the orthographic projection of the second gate line on the base substrate.

7. The display panel of claim 3, wherein the display panel further comprises a third insulating layer, and the storage capacitor further comprises:
a third storage electrode portion arranged in a third metal layer located on a side of the active layer facing the base substrate, wherein the orthographic projection of the first storage electrode portion on the base substrate at least partially overlaps the orthographic projection of the second storage electrode portion on the base substrate, and an orthographic projection of the third storage electrode portion on the base substrate at least partially overlaps the orthographic projection of the second storage electrode portion on the base substrate, and the third insulating layer is located on a side of the third metal layer away from the base substrate and on the side of the active layer facing the base substrate; and
a third via structure that passes through the first insulating layer, the second insulating layer and the third insulating layer, so that the first storage electrode portion is electrically connected to the third storage electrode portion through the third via structure.

8. The display panel of claim 7, wherein each of the orthographic projection of the first storage electrode portion of the storage capacitor on the base substrate, the orthographic projection of the second storage electrode portion of the storage capacitor on the base substrate and the orthographic projection of the third storage electrode portion of the storage capacitor on the base substrate at least partially overlaps the orthographic projection of the plurality of hollow portions of the pixel defining layer on the base substrate.

9. The display panel of claim 8, wherein at least 70% of an area of each of the orthographic projection of the first storage electrode portion of the storage capacitor on the base substrate, the orthographic projection of the second storage electrode portion of the storage capacitor on the base substrate and the orthographic projection of the third storage electrode portion of the storage capacitor on the base substrate falls within the orthographic projection of the plurality of hollow portions of the pixel defining layer on the base substrate.

10. An electronic device, comprising the display panel of claim 1.

11. The display panel of claim 2, further comprising:
a planarization layer located on a side of the second metal layer away from the base substrate and on a side of the pixel defining layer facing the base substrate, wherein the anode layer is located on a side of the planarization layer away from the base substrate and on the side of the pixel defining layer facing the base substrate; and a first via structure that passes through the planarization layer, so that the anode layer is electrically connected to the first storage electrode portion through the first via structure.

12. The display panel of claim 3, further comprising:
a planarization layer located on a side of the second metal layer away from the base substrate and on a side of the pixel defining layer facing the base substrate, wherein the anode layer is located on a side of the planarization layer away from the base substrate and on the side of the pixel defining layer facing the base substrate; and
a first via structure that passes through the planarization layer, so that the anode layer is electrically connected to the first storage electrode portion through the first via structure.

* * * * *